(12) United States Patent
Streck et al.

(10) Patent No.: US 8,609,555 B2
(45) Date of Patent: Dec. 17, 2013

(54) INCREASED STABILITY OF A COMPLEX MATERIAL STACK IN A SEMICONDUCTOR DEVICE BY PROVIDING FLUORINE ENRICHED INTERFACES

(75) Inventors: Christof Streck, Coswig (DE); Hartmut Ruelke, Dresden (DE); Heinz-Juergen Voss, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 191 days.

(21) Appl. No.: 13/115,192

(22) Filed: May 25, 2011

(65) Prior Publication Data
US 2012/0025392 A1   Feb. 2, 2012

(30) Foreign Application Priority Data
Jul. 30, 2010   (DE) .......................... 10 2010 038 739

(51) Int. Cl.
*H01L 21/31*   (2006.01)
(52) U.S. Cl.
USPC .................................. 438/787; 257/E21.276
(58) Field of Classification Search
None
See application file for complete search history.

(56) References Cited

U.S. PATENT DOCUMENTS

| | | | |
|---|---|---|---|
| 5,665,611 A * | 9/1997 | Sandhu et al. | 438/162 |
| 6,251,770 B1 | 6/2001 | Uglow et al. | |
| 7,638,424 B2 * | 12/2009 | Richter et al. | 438/625 |
| 7,781,306 B2 * | 8/2010 | Kakehata | 438/455 |
| 2001/0016405 A1 * | 8/2001 | Nguyen et al. | 438/586 |
| 2002/0133258 A1 | 9/2002 | Ngai et al. | |
| 2004/0253828 A1 * | 12/2004 | Ozawa et al. | 438/710 |
| 2005/0133921 A1 * | 6/2005 | Oki et al. | 257/758 |

OTHER PUBLICATIONS

Translation of Official Communication from German Patent Application 10 2010 038 739.8-33 dated Mar. 29, 2011.

* cited by examiner

*Primary Examiner* — Alonzo Chambliss
(74) *Attorney, Agent, or Firm* — Williams, Morgan & Amerson, P.C.

(57) ABSTRACT

When forming complex metallization systems, a sensitive material, such as a ULK material, may be deposited on a silicon-containing dielectric material, such as an etch stop material, with superior adhesion by performing a surface treatment on the basis of fluorine radicals. Due to the fluorine treatment, silicon-fluorine bonds are generated, which are then broken up upon interacting with the chemically active component during the further deposition process. Consequently, the subsequent material layer is chemically bonded to the underlying material, thereby imparting superior stability to the interface, which in turn may result in superior robustness and reliability of the metallization system upon performing reflowing processes and operating complex packaged semiconductor devices.

15 Claims, 5 Drawing Sheets

INCREASED STABILITY OF A COMPLEX MATERIAL STACK IN A SEMICONDUCTOR DEVICE BY PROVIDING FLUORINE ENRICHED INTERFACES

BACKGROUND OF THE INVENTION

1. Field of the Invention

Generally, the present disclosure relates to integrated circuits, and, more particularly, to techniques for increasing mechanical stability of complex material stacks, for instance for reducing chip-package interactions caused by thermal mismatch between the chip and the package, in particular during reflowing a bump structure for directly connecting the chip and the package.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as SOI (silicon-on-insulator) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the substrate. Thus, economic constraints drive semiconductor manufacturers to steadily increase the substrate dimensions, thereby also increasing the area available for producing actual semiconductor devices and thus increasing production yield. Additionally, the size of the individual die regions on the wafer is increased in order to integrate more and more circuit portions, even of very different type, thereby achieving very complex integrated circuits executing sophisticated tasks.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the feature sizes of circuit elements are steadily scaled down. Due to this ongoing demand for shrinking the feature sizes of highly sophisticated semiconductor devices, copper, in combination with a low-K dielectric material, has become a frequently used alternative in the formation of so-called interconnect structures comprising metal line layers and intermediate via layers that include metal lines as intra-layer connections and vias as inter-layer or vertical connections, which commonly connect individual circuit elements to provide the required functionality of the integrated circuit. Typically, a plurality of metal line layers and via layers stacked on top of each other is necessary to realize the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased, while the conductivity of the lines is reduced due to a reduced cross-sectional area. For this reason, traditional dielectrics, such as silicon dioxide (k>3.6) and silicon nitride (k>5), are replaced by dielectric materials having a lower permittivity, which are, therefore, also referred to as low-k dielectrics having a relative permittivity of 3 or less. The density and mechanical stability or strength of the low-k materials, however, may be significantly less compared to the well-approved dielectrics silicon dioxide and silicon nitride. As a consequence, during the formation of the metallization system and any subsequent manufacturing processes of integrated circuits, production yield may depend on the mechanical characteristics of sensitive dielectric materials, such as low-k dielectric layers, and their adhesion to other materials.

Due to the reduced mechanical stability of advanced dielectric materials having a dielectric constant of 3.0 and less, device reliability may be affected by the provision of these materials during operation of sophisticated semiconductor devices and in particular during the further processing of the device caused by the interaction between a chip and the package due to a thermal mismatch of the corresponding thermal expansion of the different materials. For instance, in the fabrication of complex integrated circuits, increasingly a contact technology may be used in connecting the package carrier to the chip, which is known as flip chip packaging technique. Contrary to the well-established wire bonding techniques in which appropriate contact pads may be positioned at the periphery of the very last metal layer of the chip, which may be connected to corresponding terminals of the package by a bond wire, in the flip chip technology, a respective bump structure may be formed on the last metallization layer, for instance comprised of a solder material which may be brought into contact with respective contact pads of the package. Thus, after reflowing the bump material, a reliable electrical and mechanical connection may be established between the last metallization layer and the contact pads of the package carrier. In this manner, a very large number of electrical connections may be provided across the entire chip area of the last metallization layer with reduced contact resistance and parasitic capacitance, thereby providing the I/O (input/output) capabilities, which may be required for complex integrated circuits, such as CPUs, storage devices and the like. During the corresponding process sequence for connecting the bump structure with a package carrier, heat may be applied to the composite device so as to reflow the solder material and establish a reliable connection between each of the bumps formed on the chip and the bumps or pads that may be provided on the package substrate. The thermally or mechanically induced stress caused by the thermal mismatch may, however, also act on the lower lying metallization layers, which may typically include low-k dielectrics.

Consequently, in sophisticated semiconductor devices, the mechanical characteristics of the low-k dielectric materials have been appropriately adjusted in order to provide the required degree of mechanical stability during the further processing and during the operation of the packaged semiconductor device. Since overall performance of sophisticated semiconductor devices is substantially determined by the signal propagation delay caused by the complex metallization system, great efforts have been made in order to further reduce the parasitic capacitance in the metallization system by further reducing the dielectric constant of the dielectric materials used therein. To this end, so-called ULK (ultra low-k) dielectric materials have been developed, which may typically represent dielectric materials with a porous structure, which may be formed on the basis of lithography techniques or on the basis of process techniques and materials in which a nano-porous structure may be induced. For example, appropriate species may be incorporated into a base material which may already have a reduced dielectric constant and, upon a subsequent treatment, for instance in the form of a heat treatment, a radiation treatment and the like, a significant portion of the species may be driven out of the base material, thereby producing a random network of pores within the base material, which may thus represent a plurality of randomly distributed "air gaps" in the base material, thereby further reducing the overall dielectric constant. In this manner, the dielectric constant may be reduced to values of 2.7 and less, which may translate into superior electrical performance of the metallization system.

The introduction of ULK dielectric materials or porous dielectric materials into the metallization system of sophisticated semiconductor devices, however, may be associated with a further reduction of the mechanical stability of the complex metallization systems, which may thus require a precise balance between electrical performance and mechanical strength of the metallization system. In most recent developments, the continuous shrinkage of critical dimensions for the individual semiconductor-based circuit elements, such as field effect transistors and the like, has brought about an even further increased packing density, thereby providing the possibility to integrate more and more functions into a single semiconductor die. Furthermore, due to advances in process tool technology and the like, and due to the demand for providing semiconductor chips having incorporated therein more and more functional circuit portions, the die size has been increased, thereby requiring very complex metallization systems in which a significant portion of the dielectric material may be provided in the form of ULK or porous dielectric materials.

Figure 1A:
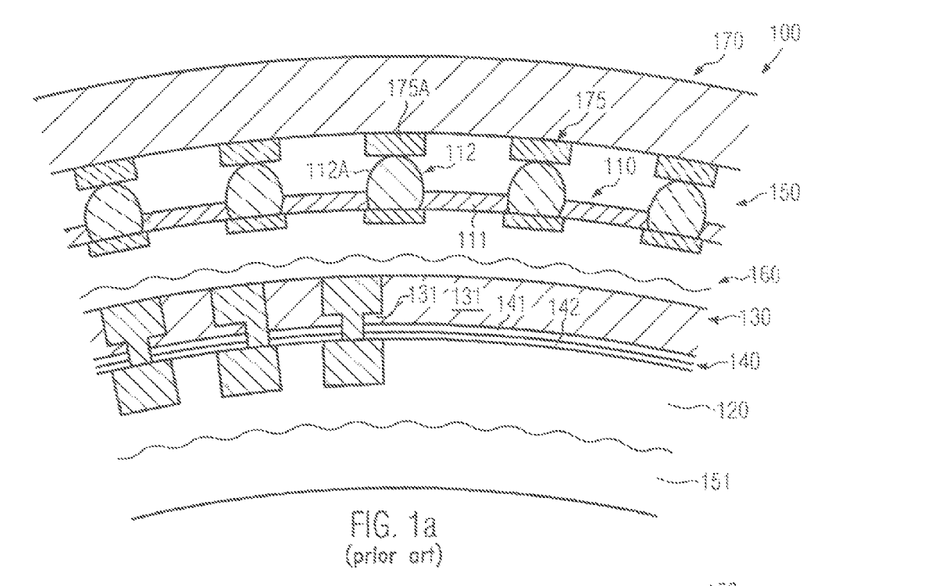
FIG. 1a schematically illustrates a cross-sectional view of a packaged semiconductor device after a reflow process, wherein a sophisticated metallization system comprises a ULK material, according to conventional techniques.
Figure 1B:
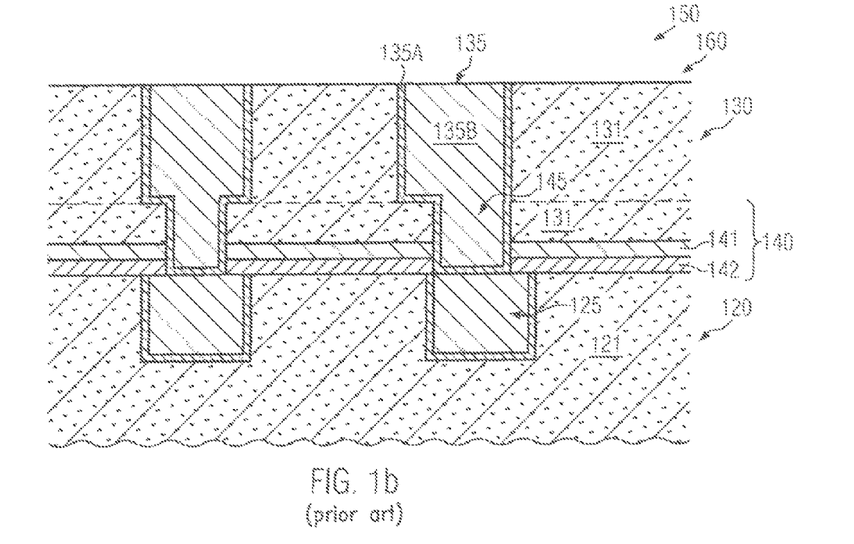
FIG. 1b schematically illustrates a cross-sectional view of a portion of the complex metallization system, which may result in increased yield losses upon performing the reflow process and which may result in reduced reliability upon operating the packaged semiconductor device.

With reference to FIGS. 1a and 1b, a complex conventional semiconductor device packaged on the basis of a bump contact regime will now be described in more detail. FIG. 1a schematically illustrates a cross-sectional view of a semiconductor device 100 in a packaged state. That is, the semiconductor device 100 comprises a semiconductor die 150 comprising a substrate 151 and a plurality of device levels formed above the substrate 151. As previously explained, the substrate 151 typically represents a silicon material or any other appropriate barrier material for forming thereon semiconductor-based circuit elements, such as transistors and the like. For convenience, any such circuit elements are not shown in FIG. 1a. Furthermore, a metallization system 160 is formed above the substrate 151 and typically comprises a plurality of metal line layers, such as layers 120 and 130, with intermediate via layers, wherein, for convenience, a single via layer 140 is illustrated in FIG. 1a. Furthermore, a contact structure or bump structure 110 is provided above the substrate 151 and may be considered as a part of the metallization system 160. The bump structure 110 comprises an appropriate dielectric material 111 and a bump system 112 comprising a plurality of contact elements or bumps 112A. For example, the bump system 112 may be comprised of copper, aluminum, tin, gold, silver and the like, or any appropriate composition of lead-free materials.

Furthermore, the packaged semiconductor device 100 comprises a carrier substrate or package substrate 170, which may have any appropriate configuration, and which comprises a complementary contact or bump structure 175 including appropriate contact elements or contact pads 175A that may be directly connected to the respective bump or contact elements 112A of the contact structure 110.

Generally, the packaged semiconductor device 100 may be formed on the basis of appropriate manufacturing strategies for providing circuit elements and the metallization system 160 in accordance with device requirements. In particular, the metallization system 160 is typically provided in the form of a sophisticated material stack comprising ultra low-k dielectrics, as will be described in more detail with reference to FIG. 1b. Furthermore, as discussed above, with the demand for the integration of more and more functions into the semiconductor die 150, appropriately selected lateral dimensions of the die 150 have to be provided, thereby, however, increasing the probability of creating serious damage, in particular in the metallization system 160, upon connecting the die 150 and the package substrate 170 and during the further lifetime of the packaged device. During a corresponding process, the package substrate 170 and the semiconductor die 150 are mechanically contacted and are heated so as to reflow any solder material, for instance provided in the form of the bumps 112A and/or in the form of the contact elements 175A so as to form, after solidification of the reflowed solder material, an intermetallic connection between the contact structure 110 and the contact structure 175. Consequently, the resulting temperature gradients induce mechanical shear forces during the reflow process, which may not be efficiently compensated for or buffered by the metallization system 160. Typically, the package substrate 170 may have a significantly greater coefficient of thermal expansion compared to the semiconductor die 150, which may result in a significant deformation of the composite device 100 during the reflow process, in particular during the solidification, when preferably the peripheral contact elements cool down faster compared to the central contact elements. Consequently, the deformation may thus result in increased mechanical stress forces in the metallization system 160. Since a significant part of the metallization system 160 may be comprised of sophisticated ULK materials, such as the material 131 in the metal line layer 130 and the via layer 140, significant shear forces may be transferred into these sensitive material systems. In particular, any interfaces between the various materials have been identified as a major source of device failures in the form of material delamination.

FIG. 1b schematically illustrates a portion of the metallization system 160 of the semiconductor die 150 in more detail. As shown, the first metal line layer 120 may comprise any appropriate dielectric material 121, such as a porous ULK material, in which metal lines 125 are formed. Moreover, the metal line layer 130 is formed above the metal line layer 120 and is electrically connected thereto by means of the intermediate via layer 140. The layer 130 comprises the ULK material 131 having a porous configuration and includes appropriate metal lines 135, which may be comprised of a conductive barrier material or material system 135A in combination with a core metal 135B. Typically, tantalum and tantalum nitride may be used as efficient barrier materials and the core metal may be provided in the form of copper and the like. As illustrated, the barrier material 135A and the core metal 135B may continuously connect and thus form a via 145 that is thus laterally embedded in the dielectric materials 131, 141 and 142 of the via layer 140.

The metallization system 160 is formed on the basis of the following processes. After completing the metal line layer 120, the dielectric material 142 is deposited, for instance, in the form of a nitrogen-containing silicon carbide material and the like, which may provide superior etch stop capabilities and may also act as an efficient copper diffusion blocking layer, if required. However, due to the incorporation of nitrogen, the layer 142 may have a moderately high dielectric constant of approximately 4.5 and higher. Thereafter, a further dielectric material, for instance in the form of silicon dioxide formed on the basis of TEOS, may be provided with a dielectric constant of 3.5 and higher, depending on the actual material composition. Thereafter, a dielectric material may be deposited and may be appropriately treated in order to obtain the desired porous state, which may be accomplished on the basis of a plurality of low-k base materials in combination with any substances that may be incorporated into the base material. Consequently, after treating the base material, the low-k dielectric material 131 in the via layer 140 and the metal line layer 130 may be obtained. Thereafter, a complex patterning process is typically performed comprising two lithography processes in order to form etch masks for defining the lateral size and position of the vias 145 and of the metal lines 135. Thereafter, the materials 135A and 135B may be provided on the basis of any appropriate process strategy, followed by the removal of any excess material. In this manner, any further metal line layers and intermediate via layers may be provided, wherein at least some of these further layers may have incorporated therein an ultra low-k dielectric material.

As discussed above, any interfaces between the various dielectric material layers have been identified as weak points in the metallization system 160, thereby causing delamination events, in particular during the packaging of the semiconductor device and also during the further processing, when the power consumption may result in significant thermally induced stress due to the thermal mismatch between the package and the silicon chip, as explained above. Consequently, in some approaches, it is attempted to increase adhesion of the sophisticated ULK material 131 to any underlying materials, such as low-k etch stop materials formed on the basis of nitrogen-containing silicon carbide materials and the like. To this end, frequently, specific surface treatments may be performed on the etch stop material prior to actually depositing the ULK material, wherein many different mechanisms may be applied. For example, a plasma-based treatment may be used in order to chemically modify the surface of the etch stop layer. To this end, argon-based plasma ambient may be used in an attempt to appropriately prepare and modify the exposed surface by an appropriate physical bombardment of the surface. In other cases, plasma based on helium may be used in order to densify the resulting surface, while, in other cases, oxygen may be applied during the plasma treatment in order to oxidize the surface. In still other cases, the surface molecules may be reduced by using hydrogen-based plasma, while, in other cases, a nitrogen-containing reactive process ambient may be established in order to create a nitride-like surface. Although these various surface treatments may result in a somewhat superior adhesion of the ULK material, it turns out, however, that in particular for complex semiconductor devices requiring low dielectric constant values in combination with a plurality of stacked metallization layers in combination with a contact regime, as described above, possibly based on a lead-free solder material which may per se result in increased mechanical stresses due to the higher melting point and the increased stiffness of the lead-free solder material, nevertheless, significant yield losses and reduced reliability may be observed.

In other approaches, a concept may be applied in which the amount of ULK material may be reduced by providing materials of superior mechanical stability, as is for instance illustrated in the form of the layer 142, which, however, nevertheless may not resolve the problem of mechanically weak interfaces between any material layer and an overlying ULK material. For these reasons, so-called transition layers or graded layers may be introduced in which the material composition may be appropriately varied so as to provide a substantially graded transition from one material composition to the material composition of the ULK material, which, however, may also result in the incorporation of a significant amount of dielectric material having an undesired high dielectric constant, while at the same time additional process complexity may also be required for the deposition of appropriate transition layers.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which the interface characteristics between a silicon-containing dielectric material and a subsequent material layer may be significantly improved by establishing modified surface conditions prior to the actual deposition of the subsequent material layer. To this end, a surface treatment on the basis of fluorine radicals may be applied in order to form silicon/fluorine bonds at the surface of the silicon-containing material layer prior to actually forming the subsequent material layer on the basis of a chemical deposition process. The fluorine radicals may be provided in the form of a "gentle" surface treatment, i.e., without causing significant surface damage, which may be accomplished by appropriately controlling the concentration of fluorine radicals in the reactive process ambient. In this manner, chemical bonds at the surface of the silicon-containing material layer formed between silicon and other atomic species or molecules may be efficiently replaced by chemical bonds between the silicon and the fluorine, thereby resulting in a removal of any unwanted atomic species or molecules. Furthermore, due to the surface modification caused by the fluorine radicals, even any other molecules adhering to the surface may be efficiently removed, thereby also creating a significant cleaning effect prior to actually depositing a further material layer. Upon performing a chemical deposition process, i.e., any deposition process in which a chemical bond may be established between surface atoms or molecules and any component provided in a deposition ambient, for instance in chemical vapor deposition (CVD) processes and any related deposition techniques, such as atomic layer deposition (ALD) and the like, the silicon/fluorine bond may be broken up and the fluorine may be replaced by the chemically active component in the deposition ambient. In this manner, chemical bonds may be established most efficiently between the silicon atoms of the underlying material layer and the chemically active components of the deposition ambient, while the fluorine species may react with other components, such as carbon and the like, depending on the specific deposition conditions.

Consequently, in sophisticated semiconductor devices, dielectric material layers which may be comprised of silicon, at least at a surface thereof, may be efficiently used as deposition surfaces for forming thereon any further materials on the basis of a high fraction of chemical bonds, thereby providing superior adhesion and thus chemical stability. In some illustrative embodiments disclosed herein, the concept of a surface treatment based on fluorine radicals may be efficiently applied to the dielectric materials of sophisticated metallization systems so that even ULK materials, or any other sensitive low-k dielectric materials, may be efficiently provided on a silicon-containing dielectric material without requiring any additional material layers or graded material compositions, thereby reducing the amount of any dielectric materials having an increased dielectric constant.

One illustrative semiconductor device disclosed herein comprises a silicon-containing etch stop layer formed above a metal region of a metallization system. The semiconductor device further comprises a low-k dielectric material formed on the etch stop layer, wherein the silicon-containing etch stop layer and the low-k dielectric material form an interface, wherein a fluorine concentration of the silicon-containing etch stop layer and the low-k dielectric material is maximal at the interface.

One illustrative method disclosed herein relates to forming a semiconductor device. The method comprises exposing a silicon-containing material layer to a reactive process ambient that comprises fluorine radicals so as to form silicon-fluorine bonds at a surface of the silicon-containing material layer. The method further comprises performing a chemical vapor deposition process so as to form a dielectric material layer on the surface that comprises the silicon-fluorine bonds.

A further illustrative method disclosed herein comprises forming an etch stop layer above a metal region of a metallization system of a semiconductor device, wherein the etch stop layer comprises a surface comprising silicon. The method further comprises exposing the surface to fluorine radicals so as to form silicon-fluorine bonds at the surface. Additionally, the method comprises forming a dielectric material layer on the surface by performing a chemical deposition process.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques and semiconductor devices in which a surface treatment based on fluorine radicals may be efficiently applied to silicon-containing surfaces of material layers prior to the deposition of a further material layer having a different material composition. It has been recognized that a treatment based on fluorine radicals may be controlled such that undue surface damage may be avoided, i.e., undue material removal of the underlying silicon-containing material layer, while nevertheless a high density of silicon-fluorine bonds may be established at the surface, which may thus efficiently interact with the deposition ambient of a process to be performed for forming another dielectric material layer on the exposed surface. The exposure to the fluorine radicals may result in the removal of unwanted molecules adhering to the surface, thereby providing a superior cleaning effect, while at the same time atomic species may also be replaced by fluorine to a high degree, thereby preparing the surface for the subsequent chemical deposition of a further material composition. The fluorine radicals may be provided on the basis of a plasma, which may be in direct contact with the surface to be treated, while, in other cases, a remote plasma source may be used in order to form the fluorine radicals, wherein the corresponding plasma gases including the fluorine radicals may then be supplied to a process chamber, which may subsequently also be used for depositing a further material layer. In other illustrative embodiments, the fluorine radicals may be generated on the basis of a thermally activated process, for instance, by using chlorine fluoride ($ClF_3$) as a precursor gas and using elevated temperatures in the range of 100-300° C.

Furthermore, the concentration of fluorine radicals may be efficiently controlled by supplying any additional process gases, such as inert gases in the form of argon, helium and the like, so that the effect of the fluorine treatment may be readily adjusted so as to obtain the desired modified surface characteristics without unduly damaging the underlying material layer. To this end, appropriate experiments may be performed, for instance, by using different fluorine radical concentrations for interaction with a silicon-containing material under consideration, wherein the resulting surface characteristics may be analyzed, for instance, by in situ techniques, such as Fourier transformed infrared spectroscopy, or any other optical inspection techniques, while, in other cases, cross-sectional analysis techniques may be applied in order to evaluate the effects of the fluorine treatment on the surface under consideration.

Consequently, by establishing superior surface conditions prior to or upon the deposition of a further material layer, the strongest possible adhesion of the further material layer may be obtained, since a high fraction of chemical bonds to the silicon atoms at the surface may be established. In this manner, the strong interface may allow the deposition of sensitive materials, such as low-k dielectric materials or ULK materials, without any additional transition layers, thereby reducing the overall dielectric constant of sophisticated metallization systems, as is also discussed above.

It should be appreciated, however, that the principles disclosed herein may also be applied to any material layer stack in which a material layer is to be formed on a silicon-containing material layer when superior interface characteristics are required.

With reference to FIGS. 2a-2g, further illustrative embodiments will now be described in more detail, wherein reference may also be made to FIGS. 1a and 1b, in particular with respect to the basic configuration of complex semiconductor devices and package substrates.

Figure 2A:
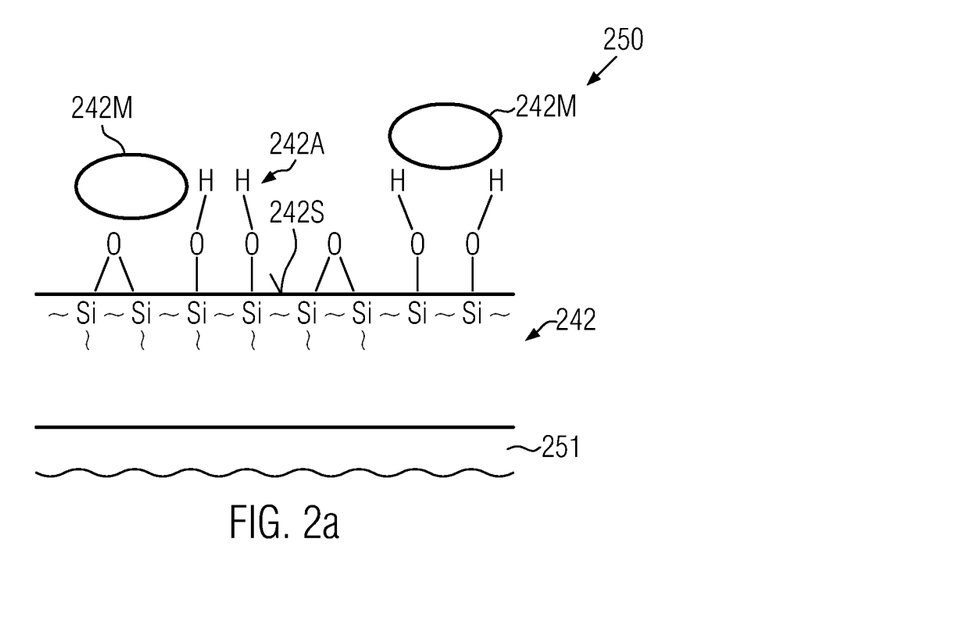
FIG. 2a schematically illustrates a cross-sectional view of a semiconductor device with a silicon-containing material layer on which is to be formed a further dielectric material with superior adhesion, according to illustrative embodiments.

FIG. 2a schematically illustrates a cross-sectional view of a semiconductor device 250 at any manufacturing stage at which a silicon-containing material layer 242 may be provided above a substrate 251, wherein the deposition of a further material layer on the layer 242 is required. In some illustrative embodiments, the substrate 251 may represent any appropriate carrier material above which may be provided one or more semiconductor layers, in and above which semiconductor-based circuit elements such as transistors and the like, are provided in accordance with the overall layout of a circuit of the device 250. For example, any such semiconductor-based circuit elements may be formed on the basis of critical dimensions of 50 nm and less, if sophisticated applications are considered. For convenience any such circuit elements are not shown in FIG. 2a. In other cases, the substrate 251 may represent the semiconductor device 250 at any manufacturing stage, for instance prior to or during the formation of semiconductor-based circuit elements in which the silicon-containing material layer 242 may require the deposition of a further material layer so as to provide superior interface characteristics. In still other cases, the layer 242 may represent a part of a metallization system of the device 250, as will be described later on in more detail. The silicon-containing material layer 242 may be a dielectric material including components such as nitrogen, oxygen, hydrogen and the like. For example, the layer 242 may represent a silicon nitride layer which may typically be understood as a material having silicon and nitrogen as the essential components, while also a certain portion of hydrogen may be incorporated. In other cases, the layer 242 may represent a nitrogen-containing silicon carbide layer which may frequently be used as an etch stop material in sophisticated metallization layers. In other cases, the layer 242 may represent a silicon dioxide layer and the like. The layer 242 may be formed on the basis of any well-established deposition recipe, for instance based on plasma enhanced or thermally activated CVD techniques and the like. It should be appreciated that the layer 242 may also be provided in the form of a material layer stack, wherein at least the uppermost layer may comprise a silicon species, or wherein at least a surface 242S may have implemented therein a significant amount of a silicon species. Upon depositing the layer 242, typically the surface 242S may be defined by a certain chemical configuration, for instance as shown in the form of oxygen and hydrogen atomic species that may chemically be bonded to the silicon species of the layer 242. Moreover, due to any imperfections upon establishing a corresponding ambient for the device 250, additional unwanted molecules, indicated by 242M, may adhere to the surface 242S or may even be chemically bonded to the surface 242S by means of any of the atomic species 242A and the like. In particular, the molecules 242M may represent any type of complex molecules which may be considered as contaminants and which may typically affect the further processing, for instance by modifying the overall interface characteristics and the like. Consequently, by providing a surface treatment on the basis of fluorine radicals, the chemical bonds at the surface 242S may be broken and a high fraction of silicon-fluorine bonds may be re-established, thereby also resulting in a release of the unwanted molecules 242M and also removing the bonded species 242A with superior efficiency, for instance compared to other surface treatments that may conventionally be applied, as is also previously explained.

Figure 2B:
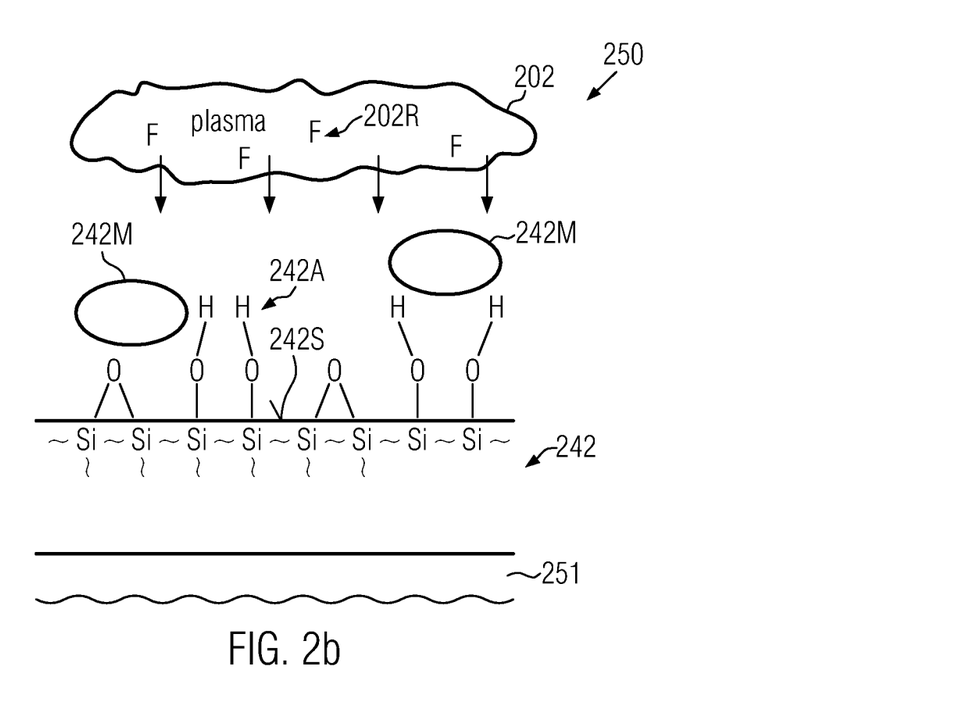
FIG. 2b schematically illustrates a cross-sectional view of the semiconductor device during a surface treatment on the basis of fluorine radicals that may be obtained on the basis of a plasma, according to illustrative embodiments.

FIG. 2b schematically illustrates the semiconductor device 250 when exposed to a process ambient 202 in which fluorine radicals 202R may be present with a desired concentration in order to interact with the surface 242S. The reactive process ambient 202 may be established on the basis of a plasma, which may be created in any appropriate process tool that may be appropriately configured for performing plasma enhanced deposition processes and the like. Moreover, in other cases, the fluorine radicals 202R may be generated in a remote process chamber and may be supplied to the ambient 202 on the basis of appropriate supply lines, as is also well established for remote plasma tools and the like. The process ambient 202 may be established by applying additional gases, such as argon, helium and the like, in order to appropriately control the concentration of the radicals 202R. It should be appreciated that appropriate parameters with respect to temperature, pressure and the like may be readily determined on the basis of corresponding parameters used in conventional surface treatments, while, on the other hand, an appropriate concentration of the fluorine radicals 202R may be determined by experiments, for instance by determining the result of the interaction of the ambient 202 with the surface 242S, which may be accomplished by using inspection techniques that are very sensitive to chemical bonds. For example, Fourier transformed infrared spectroscopy (FTIR) may be efficiently applied in order to monitor the modification of the surface 242S, wherein, in combination with other monitoring techniques, a degree of surface damage may also be observed. Consequently, based on the characteristics of the layer 242, appropriate process parameters, for instance in terms of flow rates of any precursor gases for forming the fluorine radicals 202R and any diluting gases, may be established. It should be appreciated that a wide variety of fluorine-containing precursor gases may be used, such as $F_2$, $NF_3$, $C_3F_8$, etc., in combination with conventional plasma enhanced deposition tools in order to provide the fluorine radicals 202R.

Figure 2C:
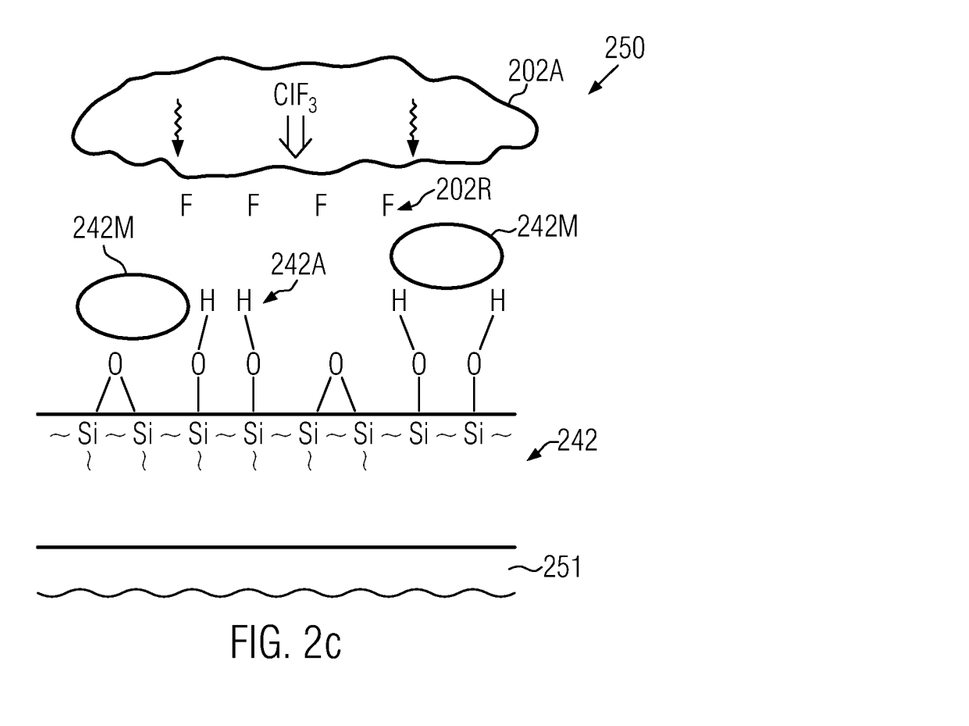
FIG. 2c schematically illustrates a cross-sectional view of the semiconductor device during a surface treatment on the basis of fluorine radicals that are obtained on the basis of a thermally activated process, according to further illustrative embodiments.

FIG. 2c schematically illustrates the semiconductor device 250 in which the fluorine radicals 202R may be established on the basis of a process ambient 202A in which a thermally activated mechanism may be applied. To this end, for instance, chlorine fluoride ($ClF_3$) may be used as a fluorine-containing precursor material, possibly in combination with inert gases, such as argon, helium and the like, in order to obtain the radicals 202R on the basis of elevated temperatures in the range of approximately 100-300° C. Also in this case, an appropriate set of process parameters may be readily determined on the basis of experiments, wherein at least one process parameter may be varied so as to achieve the desired degree of surface modification without unduly damaging the material layer 242.

Figure 2D:
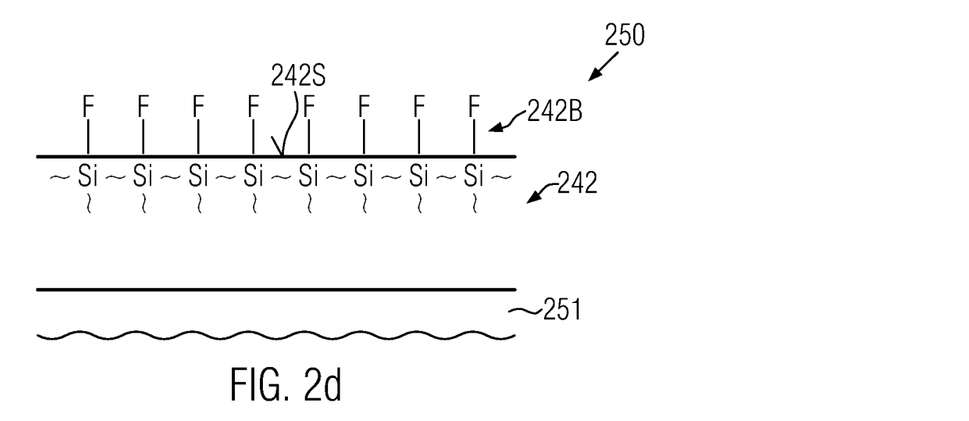
FIG. 2d schematically illustrates a cross-sectional view of the semiconductor device after the treatment on the basis of fluorine radicals with a high density of silicon-fluorine bonds at the surface of the silicon-containing material layer, according to illustrative embodiments.

FIG. 2d schematically illustrates the device 250 after the surface treatment of the layer 242 on the basis of fluorine radicals. As illustrated, at the surface 242S, a plurality of silicon-fluorine bonds 242B have been established, thereby efficiently removing any other atomic species and also unwanted molecules in the form of adhering molecules, chemically bonded molecules and the like. Thus, after the treatment, the surface 242S may be provided with a high degree of uniformity with respect to its chemical behavior in a subsequent chemically driven deposition process.

Figure 2E:
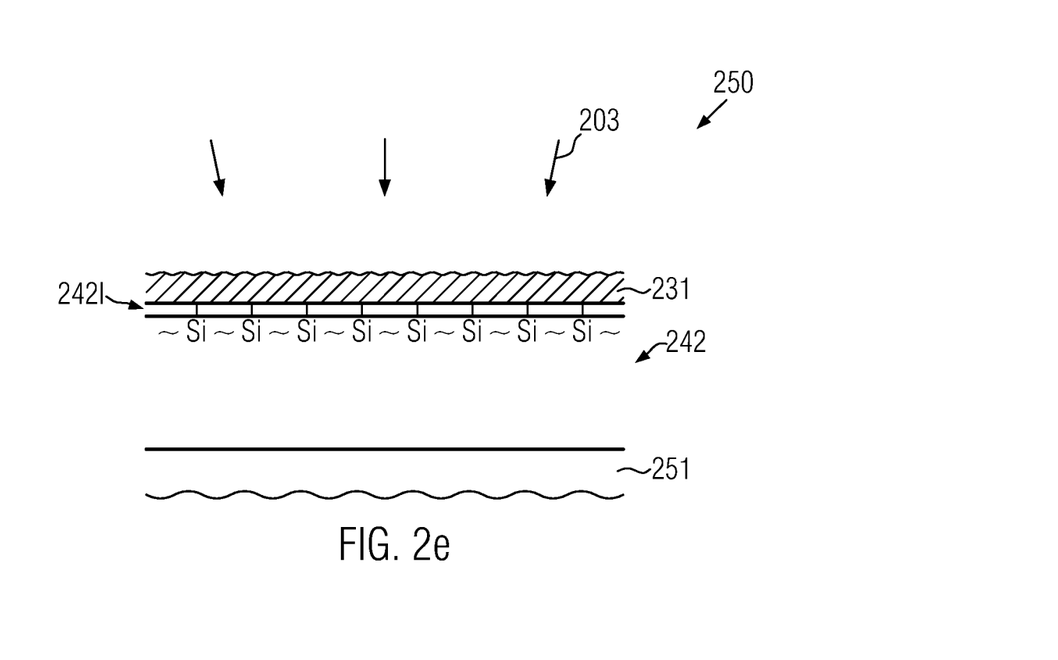
FIG. 2e schematically illustrates a cross-sectional view of the semiconductor device during the chemical deposition of a further material layer, according to illustrative embodiments.

FIG. 2e schematically illustrates the semiconductor device 250 when exposed to a chemical deposition process 203, in which a further dielectric material layer 231 is to be formed on the layer 242. To this end, any well-established chemically driven deposition technique, such as CVD-like deposition processes, may be applied, wherein typically the silicon-fluorine bonds 242B of FIG. 2d may be broken up and may be replaced by a chemical bond 242I formed between the silicon species of the layer 242 and a chemical reactive component of the layer 231. In this manner, the layer 231 may strongly adhere to the silicon-containing material layer 242 since the corresponding interface 242I may be established on the basis of a high density of chemical bonds, thereby imparting superior mechanical stability to the interface 242I. In some illustrative embodiments, the dielectric layer 231 may be provided in the form of a low-k dielectric material which may, for instance, be used in critical areas upon forming semiconductor-based circuit elements, such as transistors and the like, while, in other cases, the layer 231 may represent an interlayer dielectric material in a sophisticated metallization system, as is also discussed above.

In this respect, it should be appreciated that the dielectric constant of dielectric materials may be estimated on the basis of well-established measurement techniques, for instance by forming an appropriate capacitive structure on any test substrates or test regions and by measuring the electrical response of the capacitive structure to an electrical stimulus. From the received electrical response, the dielectric constant of the dielectric material may then be readily determined. Similarly, a dielectric constant value may be associated with a certain dielectric material by determining its material composition, including the degree of porosity, and measuring the dielectric constant for any appropriate capacitive structure using the material composition of interest. It should be noted that any values for a dielectric constant may thus be understood as referring to a certain measurement strategy, wherein typically the corresponding measurement results for the dielectric constant may vary by less than approximately 2-5 percent. In this sense, a dielectric material having a dielectric constant of 3.0 or less may generally be referred to as a low-k dielectric material, while a ULK material may be considered as a material having a dielectric constant of 2.7 and less.

Figure 2F:
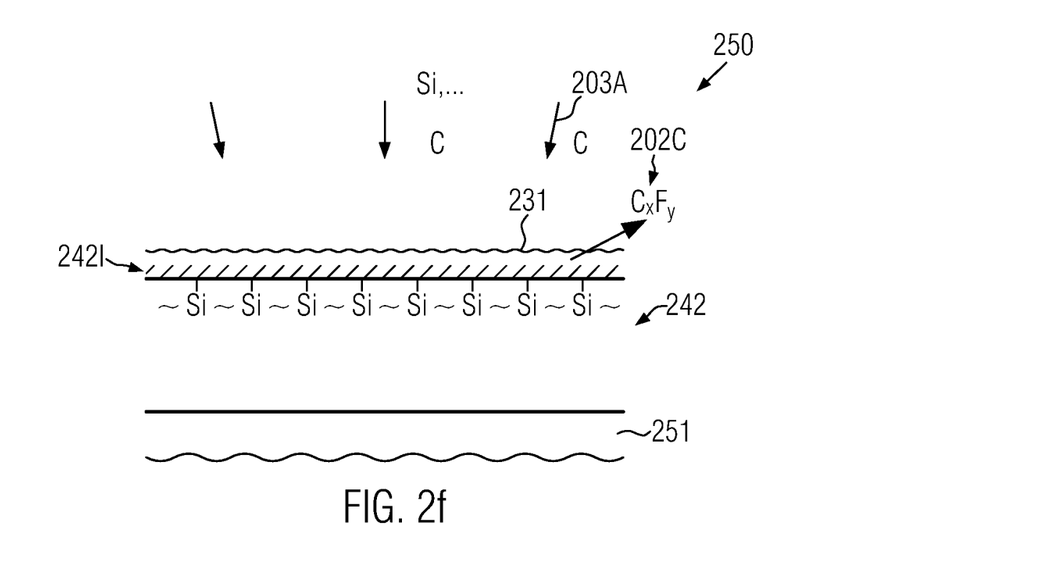
FIG. 2f schematically illustrates a cross-sectional view of the semiconductor device during a deposition process for forming a ULK material on the basis of a carbon species, according to illustrative embodiments.

FIG. 2f schematically illustrates the semiconductor device 250 according to further illustrative embodiments. As illustrated, the material layer 242 having experienced the surface treatment based on fluorine radicals, as discussed above, may be exposed to a deposition ambient 203A in which the material layer 231 may be formed so as to have a very low dielectric constant value, for instance by depositing the material as a substantially porous material and the like. In many cases, the deposition ambient 203A may comprise a carbon species since presently a plurality of ultra low-k materials may have incorporated therein a carbon material. In this case, the fluorine present at the interface 242I upon forming the layer 231 may efficiently interact with the carbon species, thereby efficiently removing the carbon species from the interface 242I, since any volatile carbon fluoride molecules, indicated by 202C, may be generated, thereby increasingly "depleting" the interface 242I in view of the carbon species. The local removal of the carbon species from the interface 242I may be advantageous in terms of superior interface stability since, in particular in ULK materials of sophisticated metallization systems, the presence of carbon at the interface has been identified as a major source of reduced stability.

After forming the dielectric layer 231 on the layer 242 having the superior interface 242I, the further processing may be continued by any appropriate process regime as required for completing the device 250. For example, any additional material layers may be formed above the layer 231, wherein at least some of these layers may be exposed to a surface treatment on the basis of fluorine radicals when having a silicon-containing surface area in order to provide superior deposition conditions upon performing a further chemically activated deposition process. In this manner, superior stability of the resulting material layer stack may be accomplished, even if sensitive materials such as low-k materials and ULK materials, may be applied.

Figure 2G:
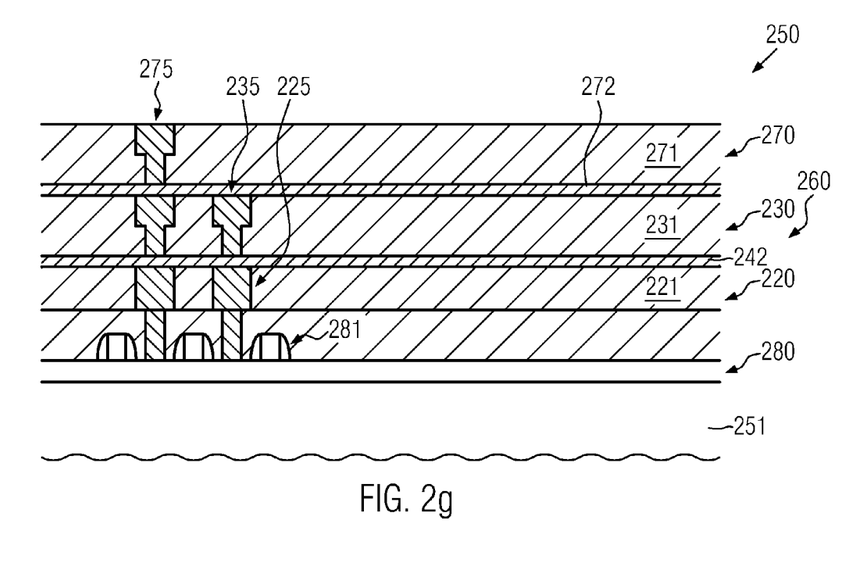
FIG. 2g schematically illustrates a cross-sectional view of the semiconductor device in which a complex metallization system may be formed on the basis of material stacks having superior interface characteristics achieved on the basis of a treatment using fluorine radicals, according to still further illustrative embodiments.

FIG. 2g schematically illustrates the semiconductor device 250 in a further advanced manufacturing stage according to illustrative embodiments. As illustrated, the device 250 may comprise a device level 280 formed above the substrate 251, wherein the device level 280 may be understood as one or more material layers in and above which may be formed a plurality of circuit elements 281, such as transistors and the like. Moreover, a metallization system 260 may be formed above the device level 280 and may comprise a plurality of metallization layers, such as layers 220, 230 and 270. At least some of the metallization layers 220, 230, 270 may be formed on the basis of low-k dielectric materials or ULK materials in order to enhance performance, as is also discussed above. For example, the metallization layer 220 may comprise the dielectric material 221 and metal lines 225, which may connect to the device level 280. Similarly, the metallization layer 230 may comprise metal lines and vias 235 so as to connect to the metallization layer 220. Similarly, the metallization layer 270 may comprise metal lines and vias 275 so as to connect to the metallization layer 230. It should be appreciated that more or less metallization layers may be provided in the metallization system 260, depending on the overall complexity of the device 250. In the embodiment shown, the metallization layer 230 may comprise the silicon-containing material layer 242, which may thus represent a dielectric cap layer or etch stop layer, followed by the dielectric material 231, which may be provided in the form of a low-k dielectric material or a ULK material. Thus, contrary to the configuration as shown in FIG. 1b, the amount of material of reduced dielectric constant increased compared to any concepts in which additional transition layers and the like are provided. Thus, generally superior performance of the metallization system 260 may be achieved. Furthermore, in the embodiment shown, the metallization layer 270 may comprise an etch stop layer 272 in the form of a silicon-containing material, which may have a similar composition as the layer 242. Furthermore, a dielectric material 271 may be formed directly on the layer 272 and may represent a low-k dielectric material or a ULK material.

Generally, the device 250 may be formed on the basis of any appropriate process strategy, for instance by forming the circuit elements 281 in compliance with the design rules, followed by the formation of the metallization system 260, which may also require providing at least some of the metal lines and vias 225, 235, 275 with a width or generally with a lateral dimension of 100 nm and significantly less. After providing the metallization layer 220 and the metal lines 225, the silicon-containing layer 242 may be formed, as is also previously discussed, followed by the deposition of the material 231, wherein the intermediate surface treatment based on fluorine radicals may provide superior interface characteristics, as is also discussed above. After patterning the materials 231 and 242, the metal lines and vias 235 may be formed, followed by the formation of the metallization layer 270, which may be accomplished on the basis of the same process techniques as described with reference to the metallization layer 230. Consequently, for otherwise the same device parameters, the metallization system 260 may be provided with superior electrical performance compared to the metallization system 160 previously explained, while at the same time superior mechanical stability may be achieved. For example, the semiconductor device 250 may be packaged on the basis of a reflow process, as is previously described with reference to FIG. 1a when referring to the semiconductor device 150 and the package substrate 170, wherein the significant deformation results in significantly reduced yield losses for the device 250. Similarly, the overall reliability may be enhanced during the operation of the device 250 in a packaged state since superior interface characteristics between silicon-containing etch stop materials and the ULK materials may be achieved. That is, the interface characteristics between the layers 242 and 231 may be enhanced by performing the fluorine treatment, which may result in an increased fluorine concentration which may still be observable after completing the semiconductor device 250. Consequently, a fluorine concentration of the material layers 242 and 231 may be maximal at the interface thereof, thereby indicating the superior interface characteristics. In other cases, when the layer 231 may be formed on the basis of a carbon species, a corresponding depletion of the carbon species may be detected at the interface, as is also previously discussed, thereby also indicating superior mechanical stability of the layer stack 242 and 231 for carbon-based ULK materials.

As a result, the present disclosure provides semiconductor devices and manufacturing techniques in which superior interface characteristics between a silicon-containing material layer and an overlying layer of different material composition may be achieved by treating the surface of the silicon-containing material layer with fluorine radicals in order to provide silicon-fluorine bonds at the interface upon depositing the further dielectric material on the basis of a chemically driven deposition process. In this manner, sensitive materials such as low-k dielectric materials and ULK materials may be chemically bonded to the underlying silicon-containing material, thereby providing superior mechanical stability, which may result in superior robustness with respect to reflow processes when packaging the semiconductor substrate. Also, during the operation of the device, enhanced reliability may be obtained due to a superior robustness with respect to thermal stresses which may typically occur due to the thermal mismatch between the package and the semiconductor substrate. Furthermore, compared to conventional strategies in which a significant amount of the material of reduced dielectric constant may be replaced by a material of higher mechanical stability, performance of the resulting complex metallization system may be enhanced due to the reduced parasitic capacitance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
   exposing a silicon-containing material layer to a reactive process ambient comprising fluorine radicals so as to form silicon-fluorine bonds at a surface of said silicon-containing material layer; and
   performing a chemical vapor deposition process so as to form a dielectric material layer on said surface comprising said silicon-fluorine bonds.

2. The method of claim 1, wherein exposing said silicon-containing material layer to said reactive process ambient comprises establishing a plasma on the basis of a fluorine-containing gas.

3. The method of claim 2, wherein said plasma is established remotely to said silicon-containing material layer.

4. The method of claim 2, wherein said plasma is established above and in contact with said silicon-containing material layer.

5. The method of claim 1, wherein exposing said silicon-containing material layer to a reactive process ambient comprises supplying a fluorine-containing gas to said process ambient and creating said fluorine radicals by thermally activating said fluorine-containing gas.

6. The method of claim 1, further comprising controlling a concentration of said fluorine radicals in said process ambient by supplying an inert gas.

7. The method of claim 1, further comprising forming an opening in said dielectric material and filling said opening with at least one metal species.

8. The method of claim 7, wherein said dielectric material layer is formed so as to have a dielectric constant of 3.0 or less.

9. The method of claim 8, wherein performing said chemical vapor deposition process comprises providing a carbon species that is incorporated in said dielectric material layer.

10. The method of claim 1, further comprising forming a second silicon-containing material layer above said silicon-containing material layer, forming a second dielectric material layer on said second silicon-containing material layer and exposing said second silicon-containing material layer to fluorine radicals prior to forming said second dielectric material layer.

11. The method of claim 1, further comprising forming a metallization system of said semiconductor device by using said silicon-containing material layer and said dielectric material layer as an etch stop layer and an interlayer dielectric material, respectively, of a metallization layer of said metallization system and directly connecting said metallization system with a package substrate by performing a reflow process.

12. A method, comprising:
forming an etch stop layer above a metal region of a metallization system of a semiconductor device, said etch stop layer comprising a surface comprising silicon;
exposing said surface to fluorine radicals so as to form silicon-fluorine bonds at said surface; and
forming a dielectric material layer on said surface by performing a chemical deposition process.

13. The method of claim 12, wherein said dielectric material layer is formed so as to have a dielectric constant of 3.0 or less.

14. The method of claim 13, wherein said dielectric material layer is formed on the basis of a carbon-containing precursor material.

15. The method of claim 12, wherein exposing said surface to fluorine radicals comprises establishing a process ambient using at least one of a fluorine containing cleaning gas and chlorine and fluorine containing gas.

* * * * *